US006724676B1

United States Patent
Schneider et al.

(10) Patent No.: US 6,724,676 B1
(45) Date of Patent: Apr. 20, 2004

(54) SOFT ERROR IMPROVEMENT FOR LATCHES

(75) Inventors: Ronny Schneider, South Burlington, VT (US); Harald Streif, South Burlington, VT (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/299,037

(22) Filed: Nov. 18, 2002

(51) Int. Cl.[7] ............................... G11C 7/00
(52) U.S. Cl. ..................... 365/225.7; 365/154
(58) Field of Search .................. 365/154, 225.7, 365/189.05

(56) References Cited

U.S. PATENT DOCUMENTS

| 5,311,070 A | * | 5/1994 | Dooley | 327/208 |
|---|---|---|---|---|
| 5,886,375 A | | 3/1999 | Sun | 257/296 |
| 5,963,489 A | * | 10/1999 | Kirihata et al. | 365/200 |
| 6,366,132 B1 | | 4/2002 | Karnik et al. | 326/121 |
| 6,373,772 B2 | * | 4/2002 | Kato et al. | 365/225.7 |
| 6,380,781 B1 | | 4/2002 | Karnik et al. | 327/215 |
| 6,436,737 B1 | | 8/2002 | Malladi | 438/127 |
| 6,603,689 B2 | * | 8/2003 | Kato et al. | 365/200 |

OTHER PUBLICATIONS

Mark–Eric Jones, Strategy for Reducing Soft Errors is Needed, Aug. 27, 2002.
Chee et al., Fast and Reliable Flip Flops and Latches.
Fisch, One Transistor ESRAM Reduces Soft Error Rates, Jun. 14, 2002.

* cited by examiner

Primary Examiner—Vu A. Le
(74) Attorney, Agent, or Firm—Moser, Patterson & Sheridan, LLP

(57) ABSTRACT

Embodiments of the present invention generally provide a soft error-resistant latch circuit. The latch circuit generally includes first and second inverters, each formed by at least two transistors. At least one delay element decouples the gate of at least one of the transistors of one of the inverters from a diffusion area of at least one of the transistors of the other inverter.

27 Claims, 6 Drawing Sheets

SOFT ERROR IMPROVEMENT FOR LATCHES

BACKGROUND OF THE INVENTION

1. Field of the Invention

Embodiments of the present invention generally relate to integrated circuits (ICs) and more particularly to soft error resistant fuse latch circuits.

2. Description of the Related Art

When alpha particles or cosmic rays strike an integrated circuit (IC) device, ionization paths through the device may result in an accumulation of charge. If this accumulation of charge reaches a switching node, such as an input gate of a transistor, the voltage level at the switching node may change sufficiently to switch the logic level at an output node. (As used herein, the term node generally refers to any connection point to a circuit.) Such a change to an erroneous logic level due to a spontaneous occurrence is referred to as a soft error. Reducing IC geometries increase the likelihood of soft errors in dense designs such as DRAMs. For example, as IC dimensions get smaller and smaller, the electrical charges involved in switching or holding nodes at certain voltages (referred to as a critical charge) become smaller too.

Soft errors are referred to as soft because, in most cases, the errors may be easily corrected by overwriting the erroneous data with valid data. For example, in the case of memory cells, data may be overwritten frequently, so that soft errors may indeed be short lived. However, soft errors may also occur in latches. Some latches, such as fuse latches, are only set once during a power-up sequence. In other words, soft errors occurring in fuse latches may not be corrected until the chip is powered down and a new power-up sequence occurs.

Latches are typically formed by cross-coupling a pair of inverters, such that the output of a forward inverter is connected to the input of a feedback inverter, while the output of the feedback inverter is connected to the input of the forward inverter. Inverters are typically constructed from a pair of differential transistors (e.g., one p-channel transistor and one n-channel transistor). In a typical latch configuration, a diffusion area of at least one transistor of one inverter (i.e., the output) is connected to a gate of at least one transistor of the other inverter (i.e., the input) via a metal wire. Alpha particles or cosmic ray strikes near the diffusion area of the one inverter may lead to an accumulation of positive or negative charges, which may be carried to the gate of the other inverter via the low resistance path of the metal wire. If sufficient charge is accumulated, the voltage state of the gate may be altered sufficiently to change the latched data (e.g., accumulated negative charge may reduce a high voltage level below a low logic switching threshold), resulting in a soft error. As an example, the critical charge required to flip a latch may be less than 100 fC., while alpha particle strikes may inject charges of 15 fC. to 150 fC.

Some conventional techniques for reducing soft errors in latches focus on increasing the size of the transistors used in constructing the latches. The increased transistor size may result in an increased critical charge required for causing a soft error, which may reduce the probability of soft error occurrence. However, the increased transistor sizes may also occupy more area, which runs counter to the desire to increase circuit density. Other techniques may add charge buffers in an effort to add parasitic capacitance to increase the critical charge required to cause a soft error. However, with shrinking technologies, the dimensions of the charge buffers also shrink, which may reduce their parasitic capacitance and, therefore, their effectiveness.

Accordingly, what is needed is an improved fuse latch circuit with an increased resistance to soft errors.

SUMMARY OF THE INVENTION

The present invention generally provides latch circuits having an increased resistance to soft errors.

For one embodiment, a soft error resistant latch circuit, generally includes first and second inverters, each formed of at least two transistors. At least one delay element decouples a diffusion area of at least one of the transistors of the first inverter from a gate of at least one of the transistors of the second inverter.

For another embodiment, a fuse latch having a first node and a second node generally includes a forward inverter having an input node for receiving a signal applied to the first node of the fuse latch and an output node for generating a signal on the second node of the fuse latch, a feedback inverter having an input node for receiving the signal generated by the forward inverter and an output node for generating a feedback signal. A first delay element decouples the output node of the forward inverter from the input node of the feedback inverter and a second delay element decouples the output node of the feedback inverter from the input node of the forward inverter.

For still another embodiment, a dynamic random access memory (DRAM) device generally includes a plurality of fuses and a plurality of fuse latches to store information about the state of the fuses. Each fuse latch generally includes a forward inverter having an input node for receiving a signal indicative of the state of one of the fuses, a feedback inverter having an input node for receiving a signal generated by the forward inverter, a first delay element to decouple an output node of the forward inverter from the input node of the feedback inverter, and a second delay element to decouple an output node of the feedback inverter from the input node of the forward inverter.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide improved fuse latch circuits with an increased resistance to soft errors. The latch circuits may be formed by a pair of inverters, as with conventional latch circuits. However, resistive and capacitive (RC) elements may be added to effectively decouple an output node (transistor diffusion area) of one inverter from an input node (transistor gate) of the other inverter. Switching times of the latches may be increased by the RC elements, which may reduce the probability of soft error occurrence. As used herein, the term RC element refers to any component, or combination of components, used to connect the output node of one inverter to the input node of another inverter that results in an increased switching time of the latch when compared to a conventional metal wire connection.

Figure 1:
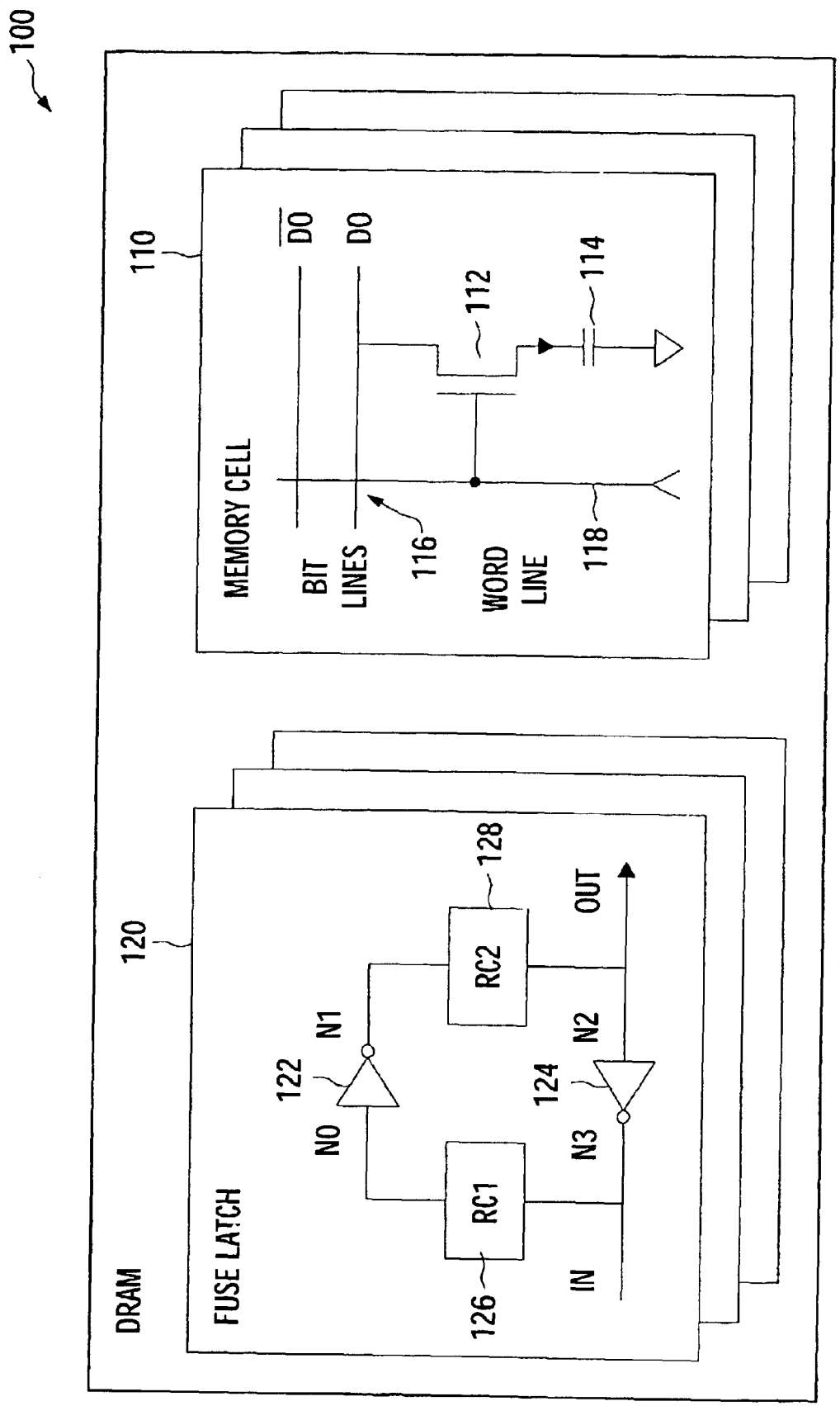
FIG. 1 is a block diagram of a dynamic random access memory (DRAM) device according to one embodiment of the present invention.

FIG. 1 is a block diagram of a dynamic random access memory (DRAM) device 100 according to one embodiment of the present invention. As illustrated, the DRAM device 100 may include a plurality of memory cells 110 and a plurality of fuse latches 120.

As illustrated, the memory cell 110 generally comprises a transistor 112 that acts as a switch and a capacitor 114 that acts as a data storage element. Data stored in the memory cell is determined as a binary value of 0 or 1 based on a voltage potential due to a charge stored in the capacitor 114. If the voltage potential is at or near a supply voltage (e.g., $V_{DD}$), the binary value is 1. If the voltage potential is at or near ground, the binary value is 0. The memory cell 110 is read by activating a WORD-LINE 118 and bit line pairs 116 (D0 and D0__). When the WORD-LINE 118 is pulled high, the transistor 112 switches on, in order to let the charge on the capacitor 114 pass to the bit line D0. Before switching on the transistor 112, the bit-lines D0 and D0__ are precharged to the same voltage level, typically half of the supply voltage (½ $V_{DD}$). Therefore, after the transistor 112 is switched on, bit-line D0 will get a new voltage potential, regardless of whether the voltage potential of capacitor 114 is $V_{DD}$ or ground. The bit line pairs 116 carry differential voltages that will be applied to a sense amplifier circuit to determine if 0 or 1 exists in that cell.

The capacitor 114 may be any suitable type capacitor, and may be formed using any suitable fabrication technique. As will be described in more detail below, for some embodiments of the present invention, the fabrication technique used to form the capacitor 114 (e.g., deep trench capacitor or stacked capacitor fabrication techniques) may also be used to form capacitive elements in the RC elements 126 and 128 used in the fuse latches 120.

As previously described, a fuse latch 120 may include a forward inverter 122 and a feedback inverter 124. Rather than directly connecting an output node (N1) of the forward inverter 122 to an input node (N2) of the feedback inverter 124, nodes N1 and N2 are decoupled by a resistive-capacitive (RC) element 128. Similarly, an output node (N3) of the feedback inverter 124 may be decoupled from an input node (N0) of the forward inverter 122 by an RC element 126. The RC elements 126 and 128 may prevent charges accumulated at transistor diffusion areas of the inverters (e.g., output nodes N1 and N3), due to alpha particle or cosmic ray strikes, from reaching transistor gates of the inverters (e.g., input nodes N0 and N2).

While FIG. 1 and the following FIGS. 2–4 illustrate two RC elements, one for decoupling the output node of a forward inverter from the input node of a feedback inverter and one for decoupling the output node of the feedback inverter from the input node of the forward inverter, for some embodiments fuse latches may include only one RC element (e.g., RC element 126 or RC element 128). In other words, depending on a specific application, a single RC element may provide adequate resistance to soft errors. Further, the RC element 126 may be positioned to decouple the input node of the fuse latch 120 from the input node (N0) of the forward inverter 122, as shown, or may be located to decouple the input node of the fuse latch 120 from the output node (N3) of the feedback inverter 124. Similarly, the RC element 128 may be positioned to decouple the output node of the fuse latch 120 from the output node (N1) of the forward inverter 122, as shown, or may be located to decouple the output node of the fuse latch 120 from the input node (N2) of the feedback inverter 124. Of course, it will also be appreciated by those skilled in the art that the output of a latch does not need to be at an opposite side of the input, and that either node of the fuse latch 120 may be used as an output. In other words, regardless of which node is actually used as an output, the latch will hold (or "latch") the node at a certain voltage level.

Figure 2A:
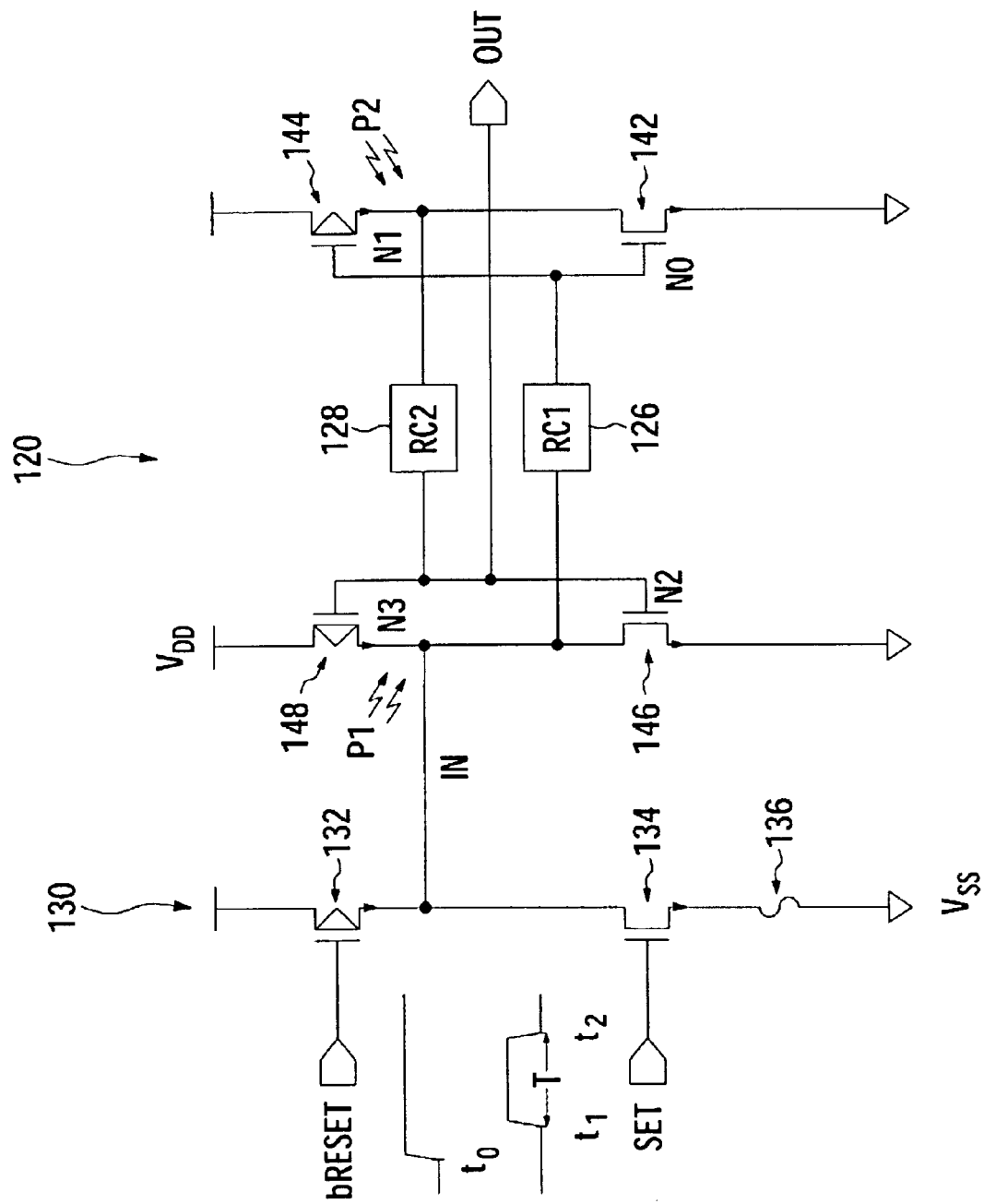
FIGS. 2A and 2B illustrate schematic diagrams of fuse latches according to embodiments of the present invention.
Figure 2B:
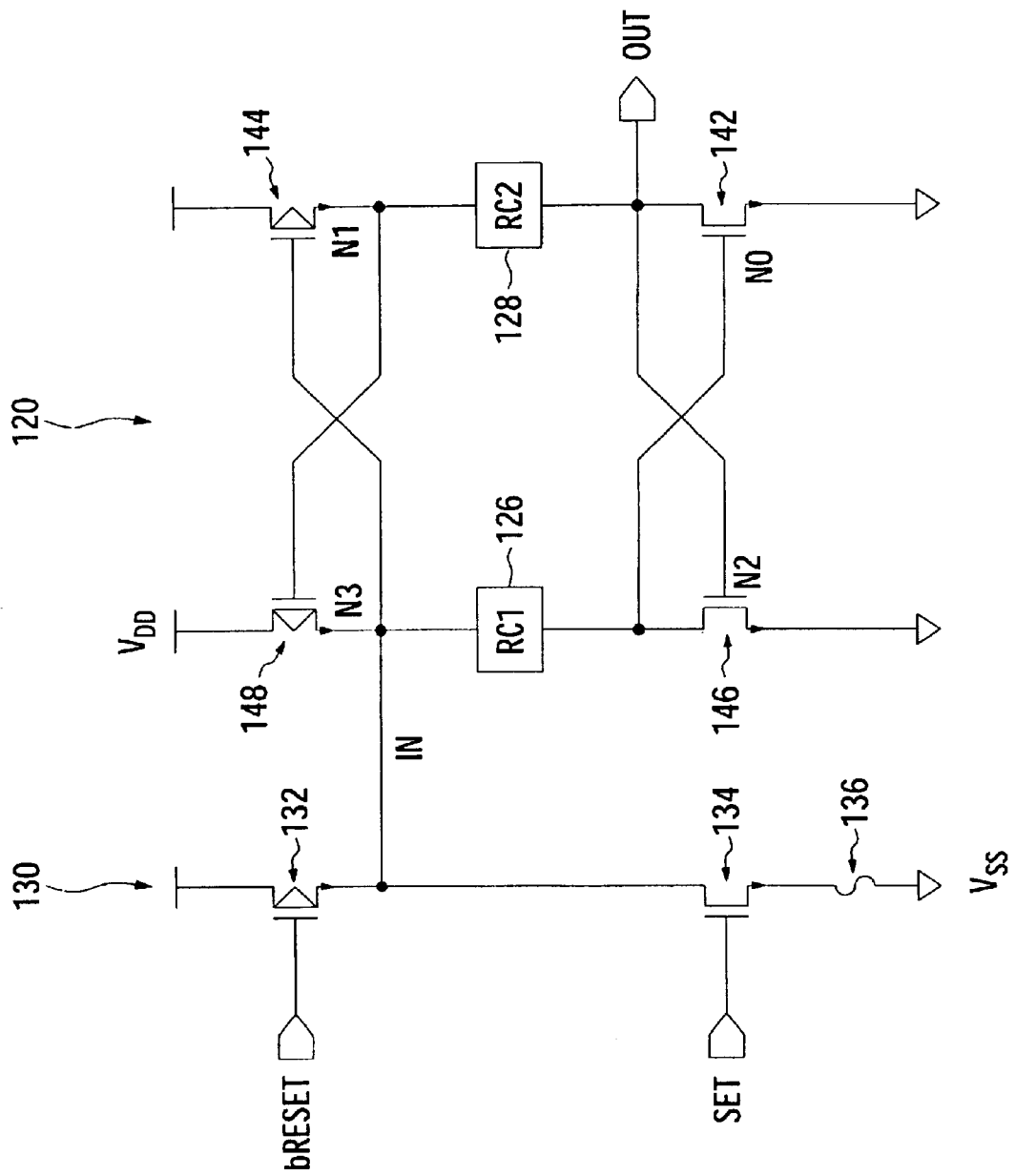

FIGS. 2A and 2B illustrate transistor-level schematic diagrams of the fuse latch 120 according to embodiments of the present invention. To facilitate understanding, the node numbers (N0–N3) from FIG. 1 are illustrated in FIGS. 2A and 2B. In general, a forward inverter (e.g., forward inverter 122 of FIG. 1) is formed by a p-channel transistor 144 and an n-channel transistor 142, while a feedback inverter (e.g., feedback inverter 124 of FIG. 1) is formed by a p-channel transistor 148 and an n-channel transistor 146.

As illustrated, the fuse latch 120 may be coupled with a fuse initialization circuit 130 for initializing the fuse latch 120 (e.g., on a power-up sequence). For example, a fuse initialization signal bRESET having the profile shown in FIG. 2A may be applied to an input terminal coupled to a gate of a p-channel transistor 132. In addition, a fuse set signal SET may be applied to another input terminal coupled to a gate of n-channel transistor 134.

Prior to initialization, an output of the fuse latch 120 may be initialized to a default value that is independent of the actual state of the fuse 136. For example, with bRESET and SET both low, p-channel transistor 132 is turned on while n-channel transistor 134 is turned off. Thus, the input of the latch circuit 120 is pulled high through p-channel transistor 132. This high voltage is simultaneously applied (via node N0) to a gate of n-channel transistor 142 and a gate of p-channel transistor 144, resulting in n-channel transistor 142 turning on while p-channel transistor 144 turns off. Accordingly, nodes N1 and N2 are pulled to ground through n-channel transistor 142, resulting in an initial logic low on an output of the latch circuit 120 (labeled OUT). In this example, a logic low on the output corresponds to a blown fuse, while a logic high on the output corresponds to an intact fuse. Of course, for other embodiments, a logic low may correspond to an intact fuse while a logic high may correspond to a blown fuse. Further, different circuit configurations may result in a different initial value for the output.

In the event of initialization, the signal bRESET becomes high,(logic 1) at time t0, and the p-channel transistor 132 turns off. As SET is initially low (logic 0), the n-channel transistor 134 is still turned off, and the initial value of the latch circuit 120 is maintained. However, once SET becomes high at time t1, the transistor 134 turns on, with the result that the fuse information of the fuse 136 can be written to the latch circuit 120. For example, if the fuse 136 is blown, the input of the latch circuit 120 will have no path to ground through the fuse 136 and no path to the supply voltage through p-channel transistor 132, which is turned off. Accordingly, the initial value of the latch circuit 120 may be maintained (as low in this example, which correctly corresponds to a blown fuse).

Alternatively, if the fuse 136 is in tact (i.e., not blown), the voltage at the input of the latch circuit 120 will be pulled to ground through the fuse 136. The low voltage at the input of the fuse latch 120 will be simultaneously applied to the gate of n-channel transistor 142 and to the gate of p-channel transistor 144 via node N0. As a result, once the fuse latch 120 settles, the n-channel transistor 142 will turn off and p-channel transistor 144 will turn on, causing nodes N1 and N2 to be pulled high through the p-channel transistor 144, resulting in a high logic level on an output of the fuse latch 120.

At time t2, after a duration T, the signal SET transitions to low. As a result, the n-channel transistor 134 is switched off and the fuse 136 is decoupled from the fuse latch 120. Because bRESET is typically held high until the next the initialization sequence, the fuse latch 120 maintains the latched value. Of course, it should be noted that the fuse latch 120 is a simplified fuse latch shown for illustrative purposes only. For different embodiments, the fuse latch 120 may include additional devices. For example, an additional n-channel transistor gated by bRESET may be placed in series with n-channel transistor 146.

The on time duration T of SET may be chosen to be sufficiently long such that voltage changes throughout the fuse latch 120 may have time to propagate through the RC elements 126 and 128. In other words, the addition of the RC elements 126 and/or 128 to the latch circuit 120 may result in greater switching times of the latch circuit 120 and, therefore, longer initialization times. However, because fuse latches are typically initialized only once during a power-up sequence, the additional delay is generally tolerable. In fact, the additional switching time of the latch circuit 120 due to the RC elements 126 and 128 may result in a higher resistance to soft errors. For example, alpha particle or cosmic ray strikes (indicated by P1) of proper energy near a diffusion area (node N3) of the p-channel transistor 148 (or n-channel transistor 146) may generate charge separation and an accumulation of charge. As previously described, in a conventional latch circuit, the accumulation of charge may have a low resistance path from the diffusion area of the p-channel transistor 148 (or n-channel transistor 146) to the gate of the n-channel transistor 142 (and p-channel transistor 144) via a metal wire. If sufficient charge reaches the gate (node N0) of the n-channel transistor 142 (or the p-channel transistor 144), the voltage levee at the gate may change (i.e. from a high to low state), resulting in a soft error.

However, in the present fuse latch 120, the increased switching time due to the RC element 126 may decrease the sensitivity of the fuse latch 120 against alpha particle or cosmic ray induced charge pulses. In a similar manner, the RC element 128 may prevent an accumulation of charge from alpha particle or cosmic ray strikes (indicated by P2) of proper energy near a diffusion area (node N1) of the p-channel transistor 144 (or the n-channel transistor 142) from reaching the gate of the n-channel transistor 146 (or the p-channel transistor 148).

In general, because radiation particles tend to strike the latch circuit 120 at or near diffusion areas (e.g., nodes N3 and N1), the RC elements 126 and/or 128 are typically positioned between an output diffusion area of one inverter and an input gate (e.g., nodes N0 and N2) of the other inverter. However, as illustrated in FIGS. 2A and 2B, due to the manner in which the inverters are constructed from transistors, the RC elements 126 and 128 may be connected at different locations while still decoupling the input of one inverter from a diffusion area of the other inverter.

For example, as illustrated in FIG. 2A, the RC element 128 may also decouple the diffusion area of p-channel transistor 144 from the gate of p-channel transistor 148, while the gate of p-channel transistor 144 and the gate of n-channel transistor 142 are coupled. Alternatively, as illustrated in FIG. 2B, the gate of p-channel transistor 144 and the gate of n-channel transistor 142 may be decoupled by the RC element 126. In both cases, however, the RC elements serve to decouple the input (gate) of one inverter from the output (diffusion area) of the other inverter. For some applications, the configuration shown in FIG. 2A may be more effective (than that shown in FIG. 2B), since the RC elements 126 and 128 decouple both gates (of transistors 142–144 and transistors 146–148, respectively) from the diffusion areas (of nodes N3 and N1, respectively). However, for different applications, the exact configuration may be determined, for example, in an effort to facilitate layout and/or minimize circuit area.

The exact configuration of RC elements may also depend on particular techniques used for fabricating the RC elements. In general, any suitable technique for increasing an effective switching time constant of a connection between the output node (diffusion area) of one inverter and the input node (gate) of the other inverter may be used to fabricate the RC elements. The switching time constant is generally proportional to the product of RC, where R is electrical resistance and C capacitance in the connection. Accordingly, the switching time constant may be increased by increasing resistance, capacitance, or both.

In general, the resistance of a track of conducting material may be expressed as:

$$R=\rho l/tw$$

where $\rho$ is resistivity of the conducting material, l is a length of the track, t is a thickness of the track, and w is a width of the track. (As used herein, the term track generally refers to any continuous body of material that may be used to connect two points in a circuit.) Alternatively, the resistance may be expressed as:

$$R=R_s(l/w)$$

where $R_s$ is the sheet resistance of the conducting material in ohms/square. Typically, transistors are fabricated using one or more metal layers and one or more layers of a gate contact material having a lower resistance than the metal layers formed on a silicon substrate. As an example, typical sheet resistance for metal layers is less than 0.1 ohms/square, while typical sheet resistance for gate contact materials, such as poly-silicon is greater than 20 ohms/square (i.e., greater than 200 times that of a typical metal layer).

Accordingly, one technique that may be used to increase the resistance of a connection between an output node of one inverter and the input node of another inverter is to make the connection using tracks of gate contact material rather than metal. In other words, the gate contact material may be used as wire. Where tracks of gate contact material are routed over diffusion areas, a transistor may be formed. The gate capacitance of the transistor formed may advantageously increase the capacitance of the connection. An advantage to this technique may be that the necessary material layers may already exist, and only wiring tracks (e.g., on a gate contact material layer) need to be formed. The gate contact wiring tracks may be formed during existing processing steps, such that additional processing steps may not be required.

Figure 3A:
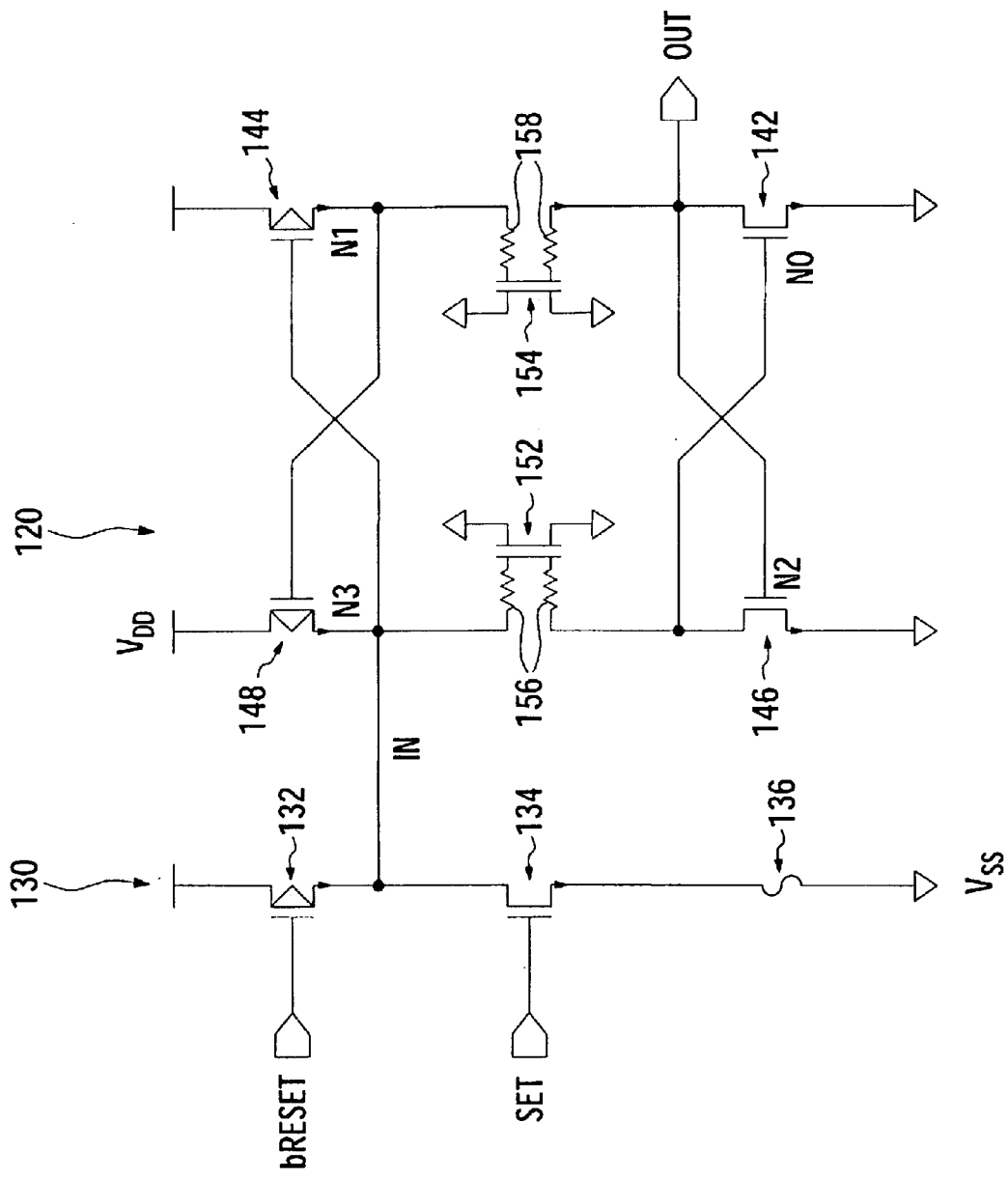
FIGS. 3A and 3B illustrate schematic diagrams of fuse latches with transistor delay elements according to embodiments of the present invention.
Figure 3B:
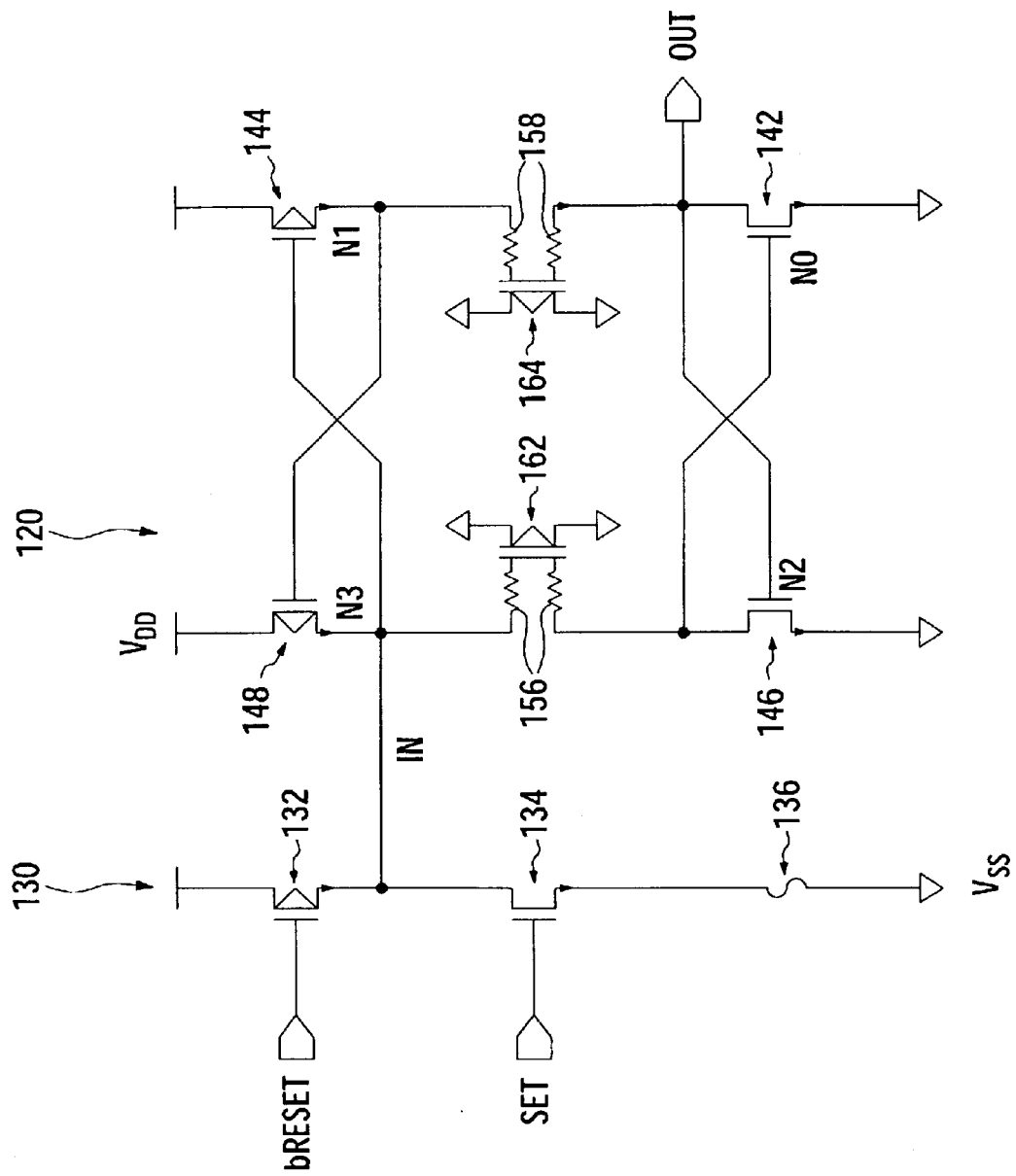

Accordingly, as illustrated in FIG. 3A, n-channel transistors 152 and 154 may be used (as RC elements) to decouple the diffusion area (node N3) of the p-channel transistor 148 from the gate (node N0) of the n-channel transistor 142 and to decouple the diffusion area (node N) of the p-channel transistor 144 from the gate (node N2) of the n-channel transistor 146, respectively. As illustrated, a special symbol used for n-channel transistors 152 and 154 shows two gate connections, having resistors 156 and 158, respectively, in series with each gate connection. The resistors 156 and 158 may represent increased resistance (when compared to metal) associated with gate contact material used to form the n-channel transistors 152 and 154, respectively. As illustrated, the source and drain of the n-channel transistors may be connected to a common supply line (e.g., GND). Accordingly, the gate contact of the n-channel transistors 152 and 154 are, in effect, used as wire. As illustrated in FIG. 3B, gate contacts of p-channel transistors 162 and 164 may also be used to as wire in a similar manner. It should also be noted that, while the n-channel transistors 152 and 154 and the p-channel transistors 162 and 164 are located according to the configuration of FIG. 2B, for other embodiments, similar transistors may be located according to configuration of FIG. 2A. As previously described, transistors located according to the configuration of FIG. 2A may decouple gates of both n-channel and p-channel transistors of one of the inverters from the diffusion areas of the other inverter, which may be more effective in preventing soft errors.

Figure 4A:
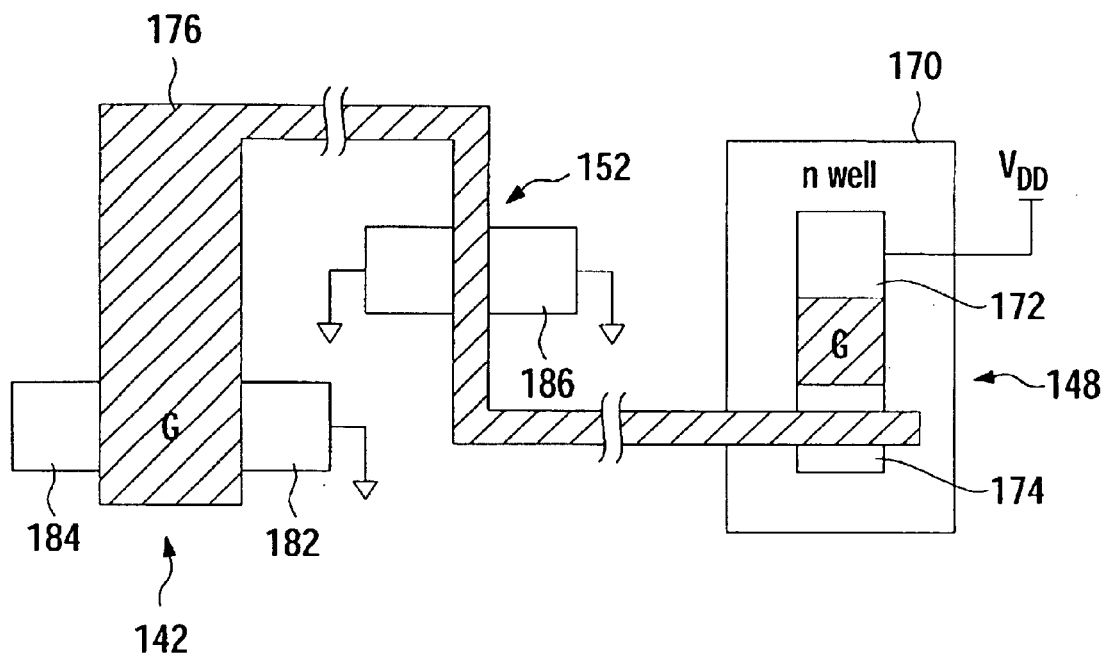
FIGS. 4A and 4B illustrate top views of exemplary circuit layouts with delay elements according to embodiments of the present invention.

FIG. 4A illustrates a top view of an exemplary circuit layout using a gate contact as wire. For example, FIG. 4A may illustrate a portion of the fuse latch 120 of FIG. 3A including n-channel transistor 142 and p-channel transistor 148. As illustrated, a track of gate contact material 176 may be used to connect the gate of n-channel transistor 142 to a diffusion area of p-channel transistor 148. The p-channel transistor 148 may include diffusion areas 172 and 174 formed in an n-well 170, while the n-channel transistor 142 may include diffusion areas 182 and 184. As illustrated, the n-channel transistor 152 may be formed where the track of gate contact material 176 is routed over a diffusion area 186.

Figure 4B:
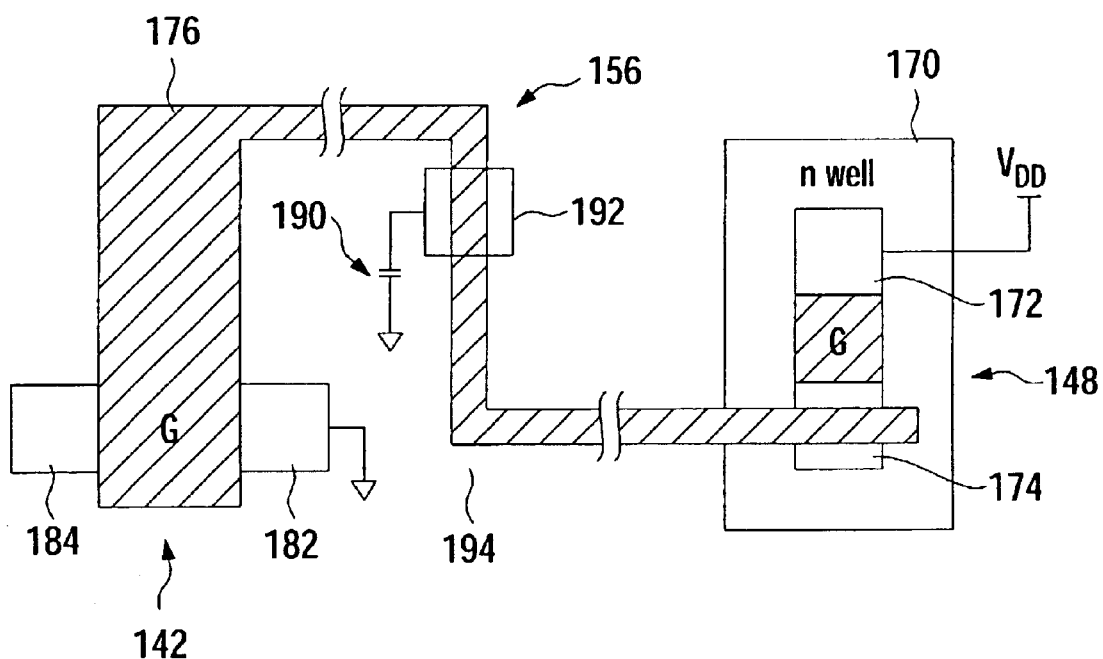

FIG. 4B illustrates a top view of an exemplary circuit layout of an RC element including a separate capacitor 190. As illustrated, the RC element may be formed with the additional capacitor 190 instead of, or in addition to, gate capacitance of a transistor (e.g., transistor 152) whose gate contact is used for wiring. As previously described, tracks of a gate contact material 176 may be used to connect the gate of n-channel transistor 142 and the diffusion area of P-channel transistor 148. As illustrated, one node of the capacitor 190 may be coupled to the tracks of gate contact material 176, for example, via a capacitor contact 192, while the other node of the capacitor 190 may be connected to ground, thus increasing the resistance and capacitance of the RC element.

The capacitor 190 may be formed by any suitable fabrication means. For example, as previously described, the capacitor 190 may be formed using fabrication techniques used in forming capacitors for the DRAM memory cells (e.g., capacitor 114 of the memory cell 110 of FIG. 1). For example, for some embodiments, capacitors used in DRAM memory cells may be formed as 3-dimensional (3-D) structures, such as deep trench capacitors or stacked capacitors. Forming 3-D capacitors may involve relatively complex fabrication steps and a large capital outlay for equipment. However, if a manufacturer is already equipped to form 3-D capacitors for memory cells, the capacitor 190 may be formed in the same processing steps, for example, without additional equipment or processing steps. Of course, the present invention also anticipates memory cell capacitors and delay element capacitors (i.e., other than deep trench and stacked capacitors) being formed using advanced fabrication techniques not presently known.

For different applications, the exact fabrication technique may depend on an amount of delay desired, which may be determined by the geometry size of transistors used to build latch circuits. For example, for some embodiments, increasing the resistance of a connection between the output node of one inverter and the input node of the other inverter may add enough delay to sufficiently reduce the probability of soft error occurrence. For other applications, additional capacitive elements may be added as a safeguard.

While the foregoing description has focused on fuse latches, the techniques described herein for making latches resistant to soft errors may be applied to any type latch where the increased switching time may be tolerated.

While the foregoing is directed to embodiments of the present invention, other and further embodiments of the invention may be devised without departing from the basic scope thereof, and the scope thereof is determined by the claims that follow.

What is claimed is:

1. A latch circuit, comprising:
   first and second inverters, each formed of at least two transistors; and
   at least one delay element decoupling a diffusion area of at least one of the transistors of the first inverter from a gate of at least one of the transistors of the second inverter, wherein the delay element comprises a deep trench capacitor.

2. A latch circuit, comprising:
   first and second inverters, each formed of at least two transistors; and
   at least one delay element decoupling a diffusion area of at least one of the transistors of the first inverter from a gate of at least one of the transistors of the second inverter, wherein the delay element comprises at least one track of gate contact material.

3. The latch circuit of claim 2, wherein the track of gate contact material is routed over a diffusion area to form a transistor.

4. The latch circuit of claim 3, wherein a source and drain of the formed transistor are tied to a common voltage level.

5. The latch circuit of claim 2, wherein the delay element comprises a capacitor.

6. The latch circuit Of claim 5, wherein the capacitor is a deep trench capacitor.

7. The latch circuit of claim 5, wherein the capacitor is a stacked capacitor.

8. The latch circuit of claim 5, wherein a node of the capacitor is electrically coupled with one or more tracks of gate contact material used to electrically couple the first and second inverters.

9. The latch circuit of claim 2, wherein:
   the first and second inverters each comprise a p-channel transistor and an n-channel transistor; and
   the delay element decouples a gate of any or both transistors of one inverter from a diffusion area of any or both transistors of the other inverter.

10. The latch circuit of claim 9, wherein the delay element is positioned to decouple gates of both the p-channel transistor and the n-channel transistor of the second inverter from diffusion areas of both the p-channel and the n-channel transistor of the first inverter.

11. A fuse latch having a first node and a second node, comprising:
- a forward inverter having an input node for receiving a signal applied to the first node of the fuse latch and an output node for generating a signal applied to the second node of the fuse latch;
- a feedback inverter having an input node for receiving the signal generated by the forward inverter and an output node;
- a first delay element to decouple the output node of the forward inverter from the input node of the feedback inverter; and
- a second delay element to decouple the output node of the feedback inverter from the input node of the forward inverter, wherein the first and second delay elements each comprise at least one deep trench capacitor.

12. The fuse latch of claim 11, wherein the second node of the fuse latch is an output node and the first delay element decouples the output node of the forward inverter from the second node of the fuse latch.

13. The fuse latch of claim 11, wherein the first node of the fuse latch is an input node and the second delay element decouples the first node of the fuse latch from the input node of the forward inverter.

14. A fuse latch having a first node and a second node, comprising:
- a forward inverter having an input node for receiving a signal applied to the first node of the fuse latch and an output node for generating a signal applied to the second node of the fuse latch;
- a feedback inverter having an input node for receiving the signal generated by the forward inverter and an output node;
- a first delay element to decouple the output node of the forward inverter from the input node of the feedback inverter; and
- a second delay element to decouple the output node of the feedback inverter from the input node of the forward inverter, wherein the first and second delay elements each comprise at least one track of gate contact material.

15. The fuse latch of claim 14, wherein, for each delay element, the track of gate contact material is routed over a diffusion area to form a transistor.

16. The fuse latch of claim 14, wherein the output node of the forward inverter and the input node of the feedback inverter are each coupled to the gate of the formed transistor of the first delay element.

17. The fuse latch of claim 14, wherein the first and second delay elements each comprise a capacitor.

18. The fuse latch of claim 17, wherein the output node of the forward inverter and the input node of the feedback inverter are each coupled with the capacitor of the first delay element via a track of gate contact material.

19. The fuse latch of claim 17, wherein the capacitor of each delay element is a deep trench capacitor.

20. A dynamic random access memory (DRAM) device, comprising:
- a plurality of fuses; and
- a plurality of fuse latches to store information about the state of the fuses, each fuse latch comprising a forward inverter having an input node for receiving a signal indicative of the state of one of the fuses, a feedback inverter having an input node for receiving a signal generated by the forward inverter, a first delay element to decouple an output node of the forward inverter from the input node of the feedback inverter, and a second delay element to decouple an output node of the feedback inverter from the input node of the forward inverter, wherein the first and second delay elements each comprise a capacitor.

21. A dynamic random access memory (DRAM) device, comprising:
- a plurality of memory cells, each comprising a capacitor;
- a plurality of fuses; and
- a plurality of fuse latches to store information about the state of the fuses, each fuse latch comprising a forward inverter having an input node for receiving a signal indicative of the state of one of the fuses, a feedback inverter having an input node for receiving a signal generated by the forward inverter, a first delay element to decouple an output node of the forward inverter from the input node of the feedback inverter, and a second delay element to decouple an output node of the feedback inverter from the input node of the forward inverter, wherein the first and second delay elements each comprise a capacitor and wherein the capacitors of the first and second delay elements and the capacitors of the memory cells are each the same type of capacitor.

22. The DRAM device of claim 21, wherein the capacitors of the delay elements and the capacitors of the memory cells are each deep trench capacitors.

23. The DRAM device of claim 21, wherein the capacitors of the delay elements and the capacitors of the memory cells are each stacked capacitors.

24. The DRAM device of claim 20, wherein a gate of at least one transistor of the forward inverter and a diffusion area of at least one transistor of the feedback inverter are each coupled with the capacitor of the second delay element via a track of gate contact material.

25. A dynamic random access memory (DRAM) device, comprising:
- a plurality of fuses; and
- a plurality of fuse latches to store information about the state of the fuses, each fuse latch comprising a forward inverter having an input node for receiving a signal indicative of the state of one of the fuses, a feedback inverter having an input node for receiving a signal generated by the forward inverter, a first delay element to decouple an output node of the forward inverter from the input node of the feedback inverter, and a second delay element to decouple an output node of the feedback inverter from the input node of the forward inverter, wherein each delay element comprises a track of gate contact material.

26. The DRAM device of claim 25, wherein, for each delay element, the track of gate contact material is routed over a diffusion area to form a transistor.

27. The DRAM device of claim 26, wherein:
- a diffusion area of at least one transistor of the forward inverter and a gate of at least one transistor feedback inverter are each coupled to the gate of the formed transistor of the first delay element; and
- a diffusion of at least one transistor of the feedback inverter and a gate of at least one transistor of the forward inverter are each coupled to the gate of the formed transistor of the second element.

* * * * *